(12) United States Patent
Bresciani et al.

(10) Patent No.: US 9,866,227 B1
(45) Date of Patent: Jan. 9, 2018

(54) SIGMA-DELTA ANALOG-TO-DIGITAL CONVERTER INCLUDING LOOP FILTER HAVING COMPONENTS FOR FEEDBACK DIGITAL-TO-ANALOG CONVERTER CORRECTION

(71) Applicant: Intel IP Corporation, Santa Clara, CA (US)

(72) Inventors: Marco Bresciani, Villach (AT); John G. Kauffman, Munich (DE); Udo Schuetz, Munich (DE); Patrick Torta, Villach (AT); Francesco Conzatti, Villach (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/391,599

(22) Filed: Dec. 27, 2016

(51) Int. Cl.
  H03M 1/00 (2006.01)
  H03M 1/10 (2006.01)
  H03M 1/46 (2006.01)
  H03M 3/00 (2006.01)

(52) U.S. Cl.
  CPC ........... H03M 1/1009 (2013.01); H03M 1/46 (2013.01); H03M 3/464 (2013.01)

(58) Field of Classification Search
  CPC ...... H03M 1/1009; H03M 3/464; H03M 1/46; H03M 1/001; H03M 1/167; H03M 1/12; H03M 3/50; H03M 3/30; H03M 1/66; H03M 1/747

USPC .......................................... 341/143, 122, 110
See application file for complete search history.

(56) References Cited

U.S. PATENT DOCUMENTS

| 5,742,246 A * | 4/1998 | Kuo ...................... H03M 3/362 341/143 |
| 8,830,097 B2 * | 9/2014 | Aruga .................... H03M 3/35 341/122 |
| 2009/0140898 A1* | 6/2009 | Ceballos ............... H03M 3/372 341/143 |
| 2015/0002325 A1* | 1/2015 | Lin ....................... H03M 3/368 341/143 |
| 2015/0061907 A1* | 3/2015 | Miglani ................ H03M 3/37 341/143 |
| 2015/0120026 A1* | 4/2015 | Zhang .................. H03M 1/186 700/94 |
| 2015/0263759 A1* | 9/2015 | Marienborg ......... H03M 3/424 341/143 |

* cited by examiner

*Primary Examiner* — Jean B Jeanglaude
(74) *Attorney, Agent, or Firm* — Schwegman Lundberg & Woessner, P.A.

(57) ABSTRACT

Some embodiments include apparatus and methods using an integrator in a loop filter of a sigma-delta analog-to-digital converter (ADC), a digital-to-analog converter (DAC) located on a feedback path of the ADC, the DAC including output nodes coupled to input nodes of the integrator, and a comparator including input nodes to receive signals from output nodes of the integrator, and an output node to provide information during calibration of the DAC.

20 Claims, 13 Drawing Sheets

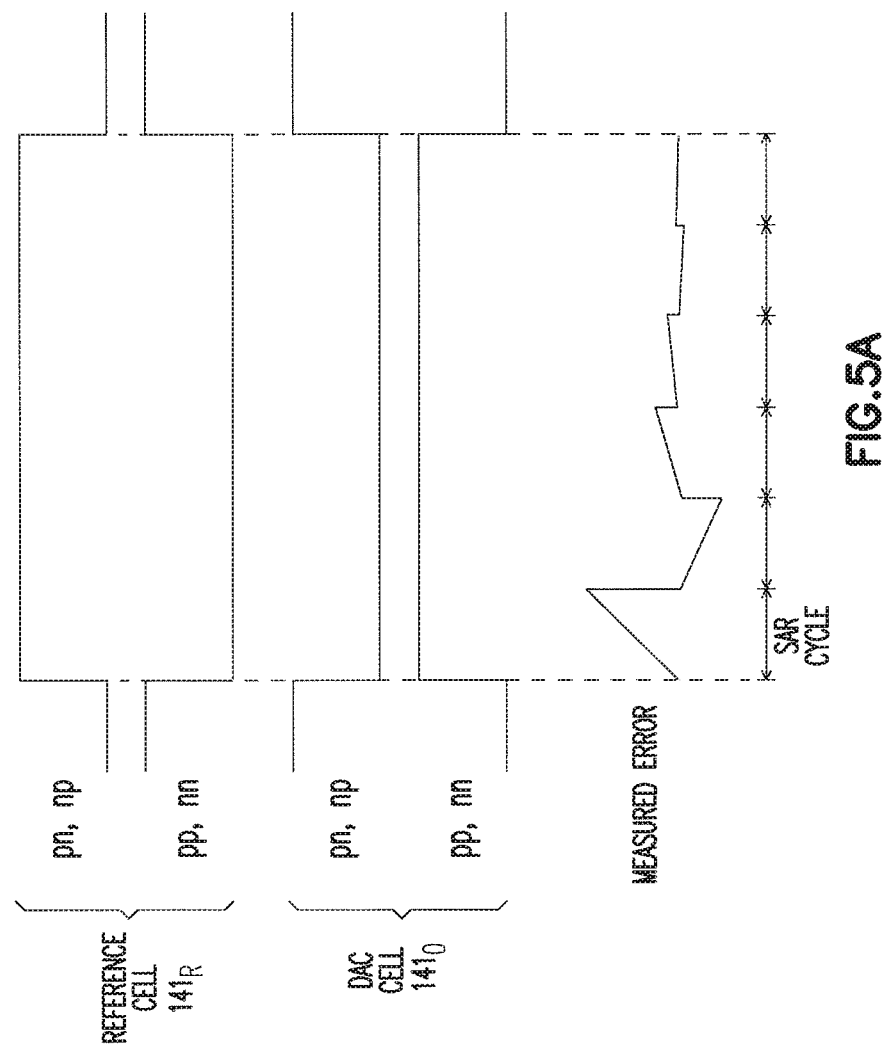

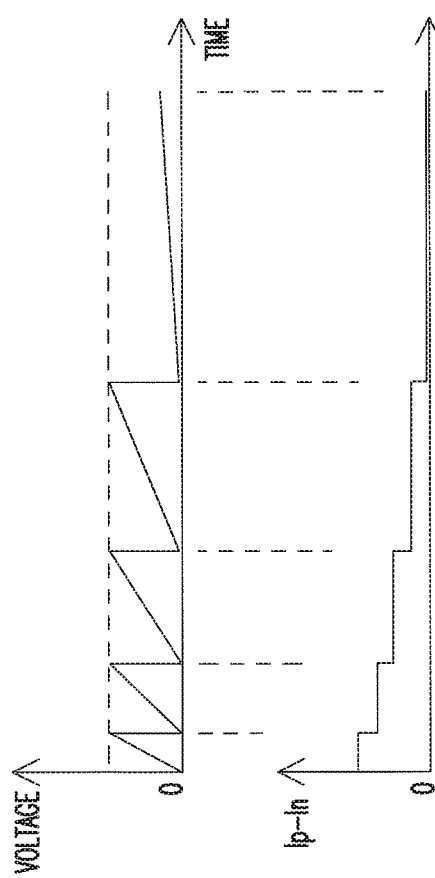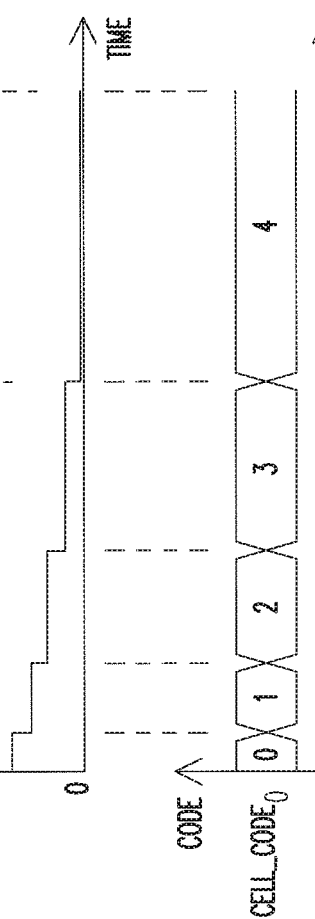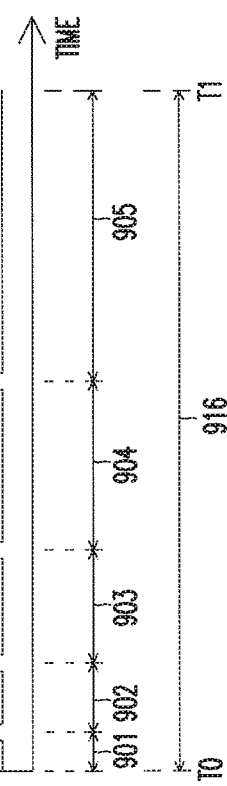

SIGMA-DELTA ANALOG-TO-DIGITAL CONVERTER INCLUDING LOOP FILTER HAVING COMPONENTS FOR FEEDBACK DIGITAL-TO-ANALOG CONVERTER CORRECTION

BACKGROUND

Analog-to-digital converters (ADCs) are widely used in electronic devices or systems such as computers, tablets, and wireless communication devices. An ADC converts analog signals into digital signals. A sigma-delta ADC is one of many types of ADCs. A sigma-delta ADC has at least one digital-to-analog converter (DAC) to provide feedback information as part of the operations of the sigma-delta ADC. Some sigma-delta ADCs have routing coupled to components of the DAC to allow testing and calibration of the DAC. In some sigma-delta ADCs, such routing is complex, causing them to be unsuitable for advanced process technology nodes.

BRIEF DESCRIPTION OF THE DRAWINGS

FIG. 5A is a timing diagram for signals applied to transistors of a reference cell and a DAC cell during calibration of the DAC cell, according to some embodiments described herein.

FIG. 8A, FIG. 8B, and FIG. 8C show graphs representing integrated error, differential current, and code, respectively, in a time domain associated with the calibration of a DAC cell of FIG. 7, according to some embodiments described herein.

DETAILED DESCRIPTION

FIG. 1 shows a sigma-delta ADC 101 including a loop filter having components for use in a calibration of DACs of sigma-delta ADC 101, according to some embodiments described herein. Sigma-delta ADC 101 can receive input information (e.g., analog signals) $V_{IN+}$ and $V_{IN-}$ at input 102 (e.g., input nodes 102a and 102b) and generate output information (e.g., digital signals) $D_{OUT}$ and $D_{OUTB}$ at an output 103 (e.g., output nodes 103a and 103b). Output information $D_{OUT}$ and $D_{OUTB}$ is a digital representation of input information $V_{IN+}$ and $V_{IN-}$.

Figures 1A, 1B:
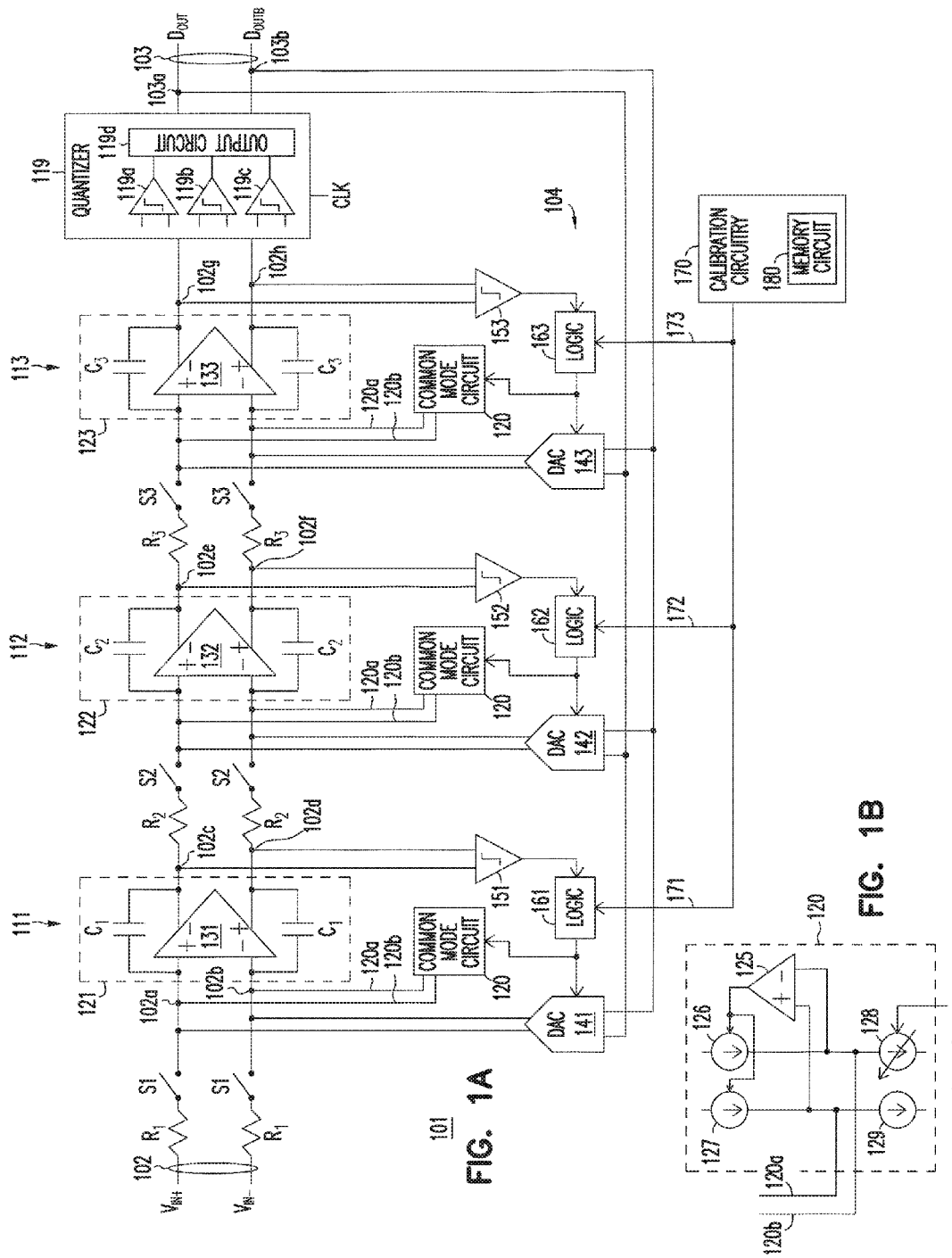
FIG. 1A shows a sigma-delta. ADC including a loop filter having components for use in a calibration of DACs of the sigma-delta ADC, according to some embodiments described herein.
FIG. 1B shows common mode circuitry of the sigma-delta ADC of FIG. 1A, according to some embodiments described herein.

As shown in FIG. 1, sigma-delta ADC 101 includes a loop filter (which includes three stages 111, 112, and 113) and a quantizer 119 coupled between input 102 and output 103 (output 103 can also be output of quantizer 119). Stages 111, 112, and 113 include integrators 121, 122, and 123, respectively. Integrator 121 includes an operational amplifier 131 and capacitors $C_1$. Integrator 122 includes an operational amplifier 132 and capacitors $C_2$. Integrator 123 includes an operational amplifier 133 and capacitors $C_3$. Sigma-delta ADC 101 includes resistors $R_1$, $R_2$, and $R_3$, and switches S1, S2, and S3 coupled in a signal path between input 102 and output 103. FIG. 1A shows an example where sigma-delta ADC 101 is a third-order sigma-delta ADC that has three stages 111, 112, and 113 (e.g., having integrators 121, 122, and 123 in the loop filter). However, sigma-delta ADC 101 can be an N-order sigma-delta ADC where N can be one or any integer greater than one. For example, sigma-delta ADC 101 can be a first-order sigma-delta ADC that has only one stage (e.g., one integrator in the loop filter), a second-order sigma-delta ADC that has two stages (e.g., two integrators in the loop filter), or a sigma-delta ADC that has more than three stages (e.g., more than three integrators in the loop filter).

Quantizer 119 can operate (e.g., based on timing of a clock signal CLK) to quantize the signals at nodes 102g and 102h (e.g., compare the signals nodes 102g and 102h with reference signals) to provide output information $D_{OUT}$ and $D_{OUTB}$ (e.g., digital signals). Information $D_{OUT}$ and $D_{OUTB}$ may be provided to another functional unit (not shown) for further processing. Quantizer 119 can include an N-bit quantizer where N=1 or N>1 (e.g., multi-level quantizer). As an example, quantizer 119 can include an N-bit ADC (e.g., where N>1), which can be any type of suitable ADC. As shown in FIG. 1A, quantizer 119 can include comparator circuitry, which can include comparators 119a, 119b, and 119c. Each of comparators 119a, 119b, and 119c can include input nodes coupled to nodes 102g and 102h receive signals from nodes 102g and 102h and compare them with reference signals. Each of comparators 119a, 119b, and 119c can include an output to provide the result of its respective comparison. Quantizer 119 can include an output circuit 119d that can operate to generate information Dour and Douro having values based on the results of comparison operation performed by comparators 119a, 119b, and 119c.

Sigma-delta ADC 101 can include a feedback path 104 coupled between output 103 and nodes 102a and 102b (e.g., input nodes of the loop filter). Feedback path 104 can include a DAC 141, a DAC 142, and a DAC 143 to provide feedback information from output 103 to stages 111, 112, and 113, respectively. Each of DAC 141, 142, and 143 can be a multi-bit DAC. DAC 141, 142, and 143 can be current steering DACs.

Sigma-delta ADC 101 can include comparators 151, 152, and 153. Comparator 151 can include input nodes coupled to nodes 102c and 102d to receive signals from output nodes of integrator 121. Comparator 152 can include input nodes coupled to nodes 102e and 102f to receive signals from output nodes of integrator 122. Comparator 153 can include input nodes coupled to nodes 102g and 102h to receive signals from output nodes of integrator 123.

Sigma-delta ADC 101 can include logic circuitry 161, 162, and 163. Each of logic circuitry 161, 162, and 163 can include components such as successive-approximation register (SAR) logic to generate codes and a selector (e.g., multiplexer) to selectively provide the codes to DAC cells of respective DAC. As shown in FIG. 1A, logic circuitry 161 can include an input node coupled to an output node of comparator 151 to receive information provided at the output node of from comparator 151. Logic circuitry 162 can include an input node coupled to an output node of comparator 152 to receive information provided at the output node of comparator 152. Logic circuitry 163 can include an input node coupled to an output node of comparator 153 to receive information provided at the output node of from comparator 153.

Sigma-delta ADC 101 may perform a calibration mode at power-on (e.g., at startup) of a device (e.g., an integrated circuit (IC) chip) that includes sigma-delta ADC 101. In the calibration mode, sigma-delta ADC 101 can use integrators 121, 122, and 123 of the loop filter as measurement error integrators to measure the DAC errors (e.g., errors caused by mismatches in DAC cells (shown in FIG. 2). Based on the measured errors, sigma-delta ADC 101 can generate codes to correct the DAC errors in DAC cells of DACs 141, 142, and 143. The codes can be stored in data registers (not shown in FIG. 1A) next to the ADC 101 after calibration. The error correction improves the linearity of the DAC cells in each of DACs 141, 142, and 143. This in turn improves the overall linearity of sigma-delta ADC 101.

During a normal operation mode, sigma-delta ADC 101 can use the stored codes to correct the DAC cells (e.g., to remove non-linearities) of DACs 141, 142, and 143. In the normal mode, sigma-delta ADC 101 can actively operate on input information $V_{IN+}$ and $V_{IN-}$ to provide information $D_{OUT}$ and $D_{OUTB}$.

In FIG. 1A, integrator 121 and comparator 151 can be part of components used during calibration mode to correct errors in DAC cells of DAC 141. Integrator 122 and comparator 152 can be part of components used during calibration mode to correct errors in DAC cells of DAC 142. Integrator 123 and comparator 153 can be part of components used during calibration mode to correct errors in DAC cells of DAC 143. As described below, DAC errors in DACs 141, 142, and 143 can be corrected in serial fashion (e.g., correcting DAC errors one DAC at a time) or in a parallel fashion (e.g., concurrently correcting DAC errors in DACs 141, 142, and 143).

As shown in FIG. 1A, integrators 121, 122, and 123 are parts of stages 111, 112, and 113 of the loop filter of sigma-delta. ADC 101. Thus, using them as part of components to correct errors in DAC cells of DACs 141, 142, and 143 of respective stages 111, 112, and 113 can allow sigma-delta ADC 101 to have less complex routing (e.g., conductive wiring) in comparison with some conventional sigma-delta ADCs. For example, some conventional sigma-delta ADCs may include dedicated components (e.g., extra integrator and routing) to access DAC for testing and calibrating of the DAC cells. Such routing may result in significant layout challenges which can be unfeasible in some technologies (e.g., CMOS technologies) due to the complexity of routing and parasitics. However, since sigma-delta ADC 101 uses the integrator already included in the loop filter of sigma-delta ADC 101, sigma-delta ADC 101 can be suitable for such technologies.

In FIG. 1A, comparators 151, 152, and 153 may be activated during a calibration mode to correct error in DAC cells in respective DACs 141, 142, and 143. Comparators 151, 152, and 153 may be deactivated after the calibration mode is completed. Thus, comparators 151, 152, and 153 may be excluded from operation of sigma-delta ADC 101 during a normal mode of sigma-delta ADC 101.

In a calibration mode of sigma-delta ADC 101, logic circuitry 161, 162, and 163 can operate to generate codes (e.g., digital codes) based on information provided by comparators 151, 152, and 153, respectively. Each of the DAC cells in each of DACs 141, 142, and 143 can include an adjustable current source (shown in FIG. 3 and FIG. 4). Calibration of DACs 141, 142, and 143 includes generating the codes to control the adjustable current source. The codes can be generated such that they have values that can result in the error being reduced to a smallest amount (e.g., a predetermined amount based on the resolution of sigma-delta ADC 101). Logic circuitry 161, 162, and 163 may be deactivated after the calibration mode is completed. Thus, logic circuitry 161, 162, and 163 may be excluded from operation of sigma-delta ADC 101 during a normal mode of sigma-delta ADC 101.

As shown in FIG. 1A, sigma-delta ADC 101 can include calibration circuitry 170, which can be activated during the calibration mode of sigma-delta. ADC 101 to control part of the calibration. For example, calibration circuitry 170 can provide control information on connections 171, 172, and 173 to respective logic circuitry 161, 162, and 163. Example of such control information can include information to perform calibration of DACs 141, 142, and 143 in a parallel fashion or in a serial fashion, as described in more detail below. As shown in FIG. 1A, calibration circuitry 170 can include a memory circuit 180, which can include memory elements (e.g., registers or memory DAC cells) to store codes generated by logic circuitry 161, 162, and 163. During a normal operation, the stored codes (which are the codes generated during the calibration mode) are used to control the adjustable current source in each of the DAC cells of each of DAC 141, 142, and 143.

As shown in FIG. 1A, each of stages 111, 112, and 113 of sigma-delta ADC 101 can include common mode circuitry 120 coupled to the input nodes of a respective integrator (among integrators 121, 122, and 123) through connections 120a and 120b.

FIG. 1B shows some components of common mode circuitry 120 including an amplifier (e.g., common feedback amplifier) 125 and current sources (e.g., common mode feedback current sources) 126 and 127, an adjustable common feedback current source 128, and a current source e.g., most significant bit) 129, which may occur during calibration of DAC 141. Amplifier 125 of common mode circuitry 120 can operate to regulate the high impedance at the input nodes of a respective integrator (e.g., nodes 102a and 102b at input nodes of integrator 121) during measuring each DAC cells mismatch error in a DAC (e.g., DAC 141) coupled to the respective integrator (e.g., integrator 121).

For example, in stage 111 (FIG. 1A), amplifier 125 (FIG. 1B) of common mode circuitry 120 can operate to control (e.g., adjust) current sources 126 and 127 based on voltages at nodes 102a and 102b (which are coupled to nodes 120a and 120b, respectively, of common mode circuitry 120) in order to maintain the common mode level at nodes 102a and 102b. Adjustable common feedback current source 128 can be adjusted (e.g., based on control from logic circuitry 161 in FIG. 1A) to correct differential error instead of sizing due to mismatch in the components of current sources 126, 127 and 129. Common mode circuitry 120 can also correct errors in comparator 151. Similarly, common mode circuitry 120 of stages 112 and 113 can operate to remove differential error at input nodes of respective integrators 122 and 123 and to correct errors in respective comparator 152 and 153.

In sigma-delta ADC 101 (FIG. 1A), in order to not load down integrators 121, 122, and 123 within the loop filter, connections on paths from the input nodes of integrators 121, 122, and 123 to amplifier 125 of respective common mode circuitry 120 can be made with the lowest parasitic. Connections on paths from nodes 102c, 102d, 102e, 102f, 102g, and 102h to respective comparators 151, 152, and 153, and logic circuitry 161, 162, and 163 can also be made with the lowest parasitic. Transistors in amplifier 125 of common mode circuitry 120 and transistors in comparators 151, 152, and 153 can be made with the smallest transistors.

Since the transistors in comparators 151, 152, and 153 and amplifier 125 are small, a calibration of the measurement loop in each of stages 111, 112, and 113 can be initially run with no reference cell or DAC cell under calibration is connected. In this calibration, logic circuitry 161, 162, and 163 can be used to correct the mismatch of the measurement loop by adjusting current source 128 (which is embedded in amplifier 125) of common mode circuitry 120 of stages 111, 112, and 113, respectively. This calibration can improve the dynamic range of the correction and adjust the adjustable current source in each DAC cell under test.

FIG. 1A shows an example where comparators 151, 152, and 153 and logic circuitry 161, 162, and 163 are located outside calibration circuitry 170. However, comparators 151, 152, and 153, or logic circuitry 161, 162, and 163, or both comparators 151, 152, and 153 and logic circuitry 161, 162, and 163 can be part of (e.g., located inside) calibration circuitry 170.

Figure 2:
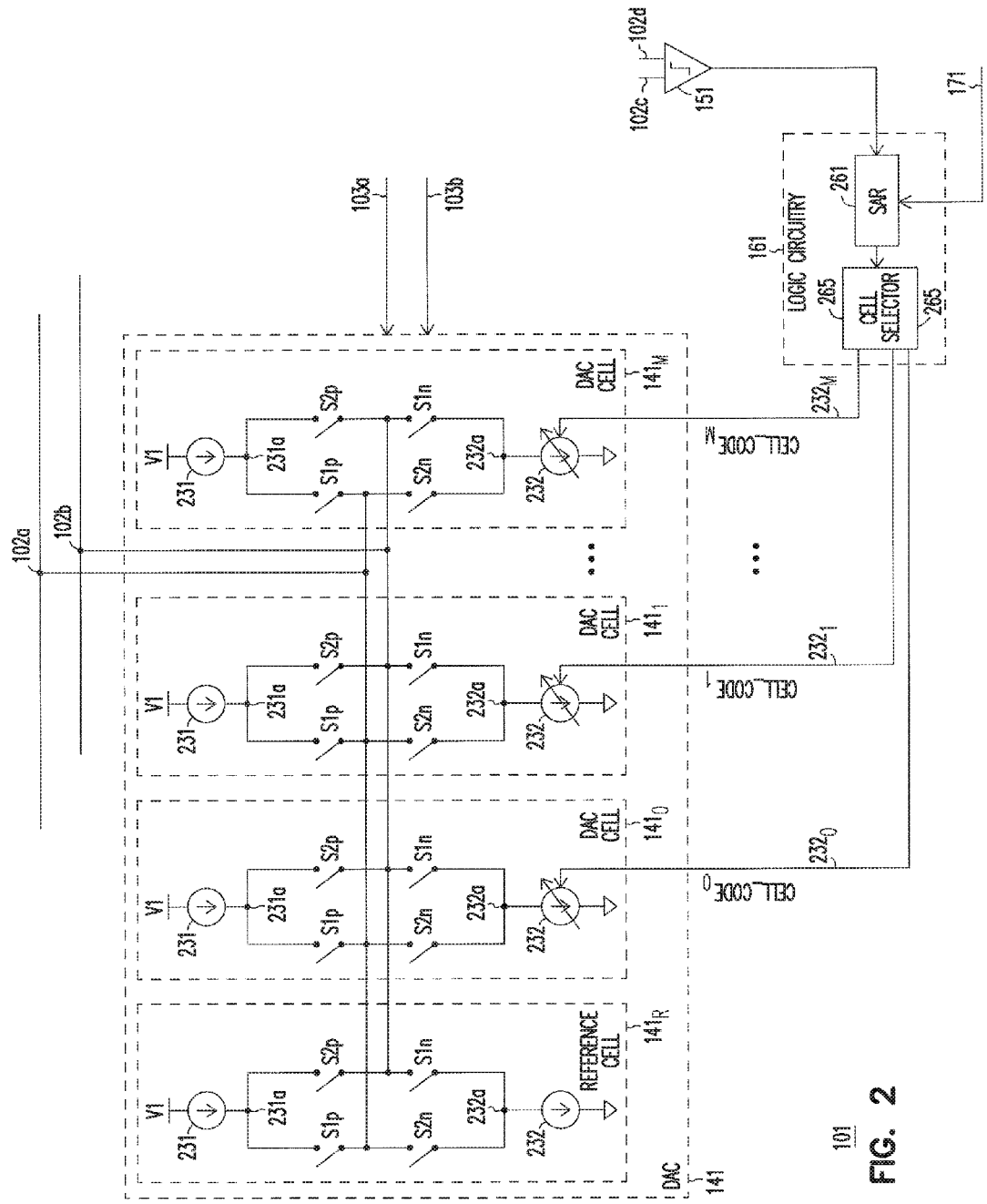
FIG. 2 shows a portion of the sigma-delta ADC of FIG. 1A, including some components of logic circuitry, and a reference cell and DAC cells of a DAC, according to some embodiments described herein.

FIG. 2 shows a portion of sigma-delta ADC 101 including some components of logic calibration 161, and a reference cell $141_R$ and DAC cells $141_0$ through $141_M$ of DAC 141, according to some embodiments described herein. DAC 142 and 143 can have a reference cell and DAC cells like DAC 141. The operation of DACs 142 and 143 and the calibration of DAC cells of DAC 142 and 143 are similar to that of DAC 141. Thus, for simplicity, the following description omits detailed descriptions of DACs 142 and 143.

FIG. 2 also shows nodes 102a and 102b (e.g., input nodes of integrator 121 of FIG. 1A) coupled to output nodes of each of DAC cells $141_R$ and $141_0$ through $141_M$, and node 103a and 103b (e.g., output nodes of quantizer 119 of FIG. 1A).

As described above, DAC 141 can be a multi-bit DAC. Thus, in the example, of FIG. 2, DAC cells $141_I$ through $141_M$ can include 16 DAC cells (e.g., M=15) if DAC 141 is a 4-bit DAC. As shown in FIG. 2, reference cell $141_R$ and DAC cells $141_I$ through $141_M$ can include similar components, including switches (e.g., transistors) S1p, S1n, S2p, and S2n, a current source 231 coupled between a supply node (which receives voltage V1 (e.g., supply voltage Vcc)) and a node 231a, and an adjustable current source 232 coupled between a supply node (e.g., ground connection (e.g., a connection to receive supply voltage Vss).

Adjustable current source 232 can be adjusted to generate different amount of currents, depending on the code used to control (e.g., control gates of transistors of adjustable current source 232).

Reference cell $141_R$ can have the same structure and function as that of each of DAC cells $141_I$ through $141_M$. During a calibration mode, each of DAC cells $141_I$ through $141_M$ is calibrated against reference cell $141_R$, so that linearity of DAC cells $141_I$ through $141_M$ can be achieved.

FIG. 2 shows reference cell 141a being part of (e.g., located in) DAC 141 as an example. However, reference cell 141a can be located outside DAC 141 and can be part of another component (e.g., part of logic circuitry 161 or calibration circuitry 170 of FIG. 1A).

As shown in FIG. 2, logic circuitry 161 can include a successive-approximation register (SAR) logic (e.g., SAR ADC) 261 and a DAC cell selector (e.g., a multiplexor (MUX)) 265. As shown in FIG. 2, SAR logic 261 can include an input node coupled to the output node of comparator 151 to receive information (e.g., the result of the comparison performed on the signals at nodes 102c and 102d from the output nodes of integrator 121 (FIG. 1A)). In an alternative structure, logic circuitry 161 can include a simple counter (e.g., instead of using SAR logic). Such an alternative structure may take more time to correct each DAC cell.

Each of logic circuitry 162 and 163 (FIG. 1A) can include components SAR logic and selector) similar to SAR logic 261 of logic circuitry 161. Thus, for simplicity, the description herein omits details of logic circuitry 162 and 163.

During a calibration mode, logic circuitry 161 can calibrate DAC cells $141_I$ through $141_M$ one at a time (e.g., in sequential fashion) against reference cell 141a until all DAC cells of DAC 141 are calibrated. The DAC cells of DAC 141 that are not being calibrated can be disconnected (e.g., power the DAC cell and open switches S1p, S2p, S1n, and S2n). Comparator 151 can perform a number of comparisons to compare the difference between voltages at nodes 102c and 102d and provide a result at its output node. SAR logic 261 can generate codes based on the comparison operations performed by comparator 151. Logic circuitry 161 can cause selector 265 to form a path from the output of SAR logic 261 to one of connections $232_0$ through $232_M$ to provide one of codes $CELL\_CODE_0$ through $CELL\_CODE$ to adjustable current source 232 of a respective DAC cell among DAC cells $141_0$ through $141_M$, depending on which DAC cell among DAC cells $141_0$ through $141_M$ is being calibrated. The calibration of each DAC cell can be completed when measured error reaches a predetermined value (e.g., zero or close to zero).

The value of codes $CELL\_CODE_0$ through $CELL\_CODE_M$ can be different from each other, or some of codes $CELL\_CODE_0$ through $CELL\_CODE_M$ may be the same, depending on error in the DAC cell (e.g., the error can be random or the same due to statics).

DACs 141, 142, and 143 of stages 111, 112, and 113 can be calibrated in a parallel fashion using their respective comparators 152, 152, and 153 and their respective logic circuitry 161, 162, and 163 of a respective stage. For example, during the same calibration mode, each of the DAC cells of DAC 142 can be calibrated against the reference cell associated with DAC 142, and each of the DAC cells of DAC 143 can be calibrated against the reference cell associated with DAC 143 while each of DAC cells $141_0$ through $141_M$ of DAC 141 is calibrated against reference cell $141_R$. In another example, DAC cells $141_0$ through $141_M$ of each of DACs 141, 142, and 143 can be calibrated against the same reference cell. In this example, DAC cells $141_0$ through $141_M$ of each of DACs 141, 142, and 143 can be calibrated in a serial fashion (e.g., one DAC cell after another) against the same reference cell.

Figure 3:
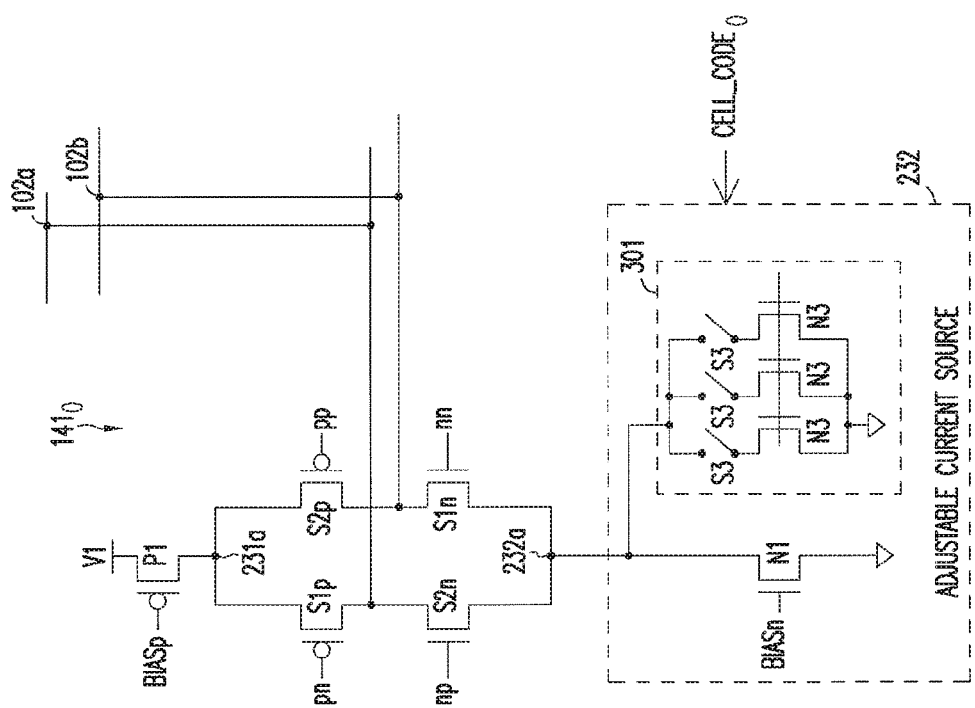
FIG. 3 shows a DAC cell of the DAC of FIG. 2, including an example of an adjustable current source of FIG. 2, according to some embodiments described herein.

FIG. 3 shows DAC cell $141_0$ of DAC 141 of FIG. 2 including an example of adjustable current source 232 of FIG. 2, according to some embodiments described herein. As shown in FIG. 3, DAC cell $141_0$ can include transistor S1p, S1n, S2p, and S2n (which are shown in FIG. 2 as switches) that are controlled by signals pn, nn, pp, and np. Signals pn and nn can be the same signal. Signals pp and np can be the same signal. DAC cell $141_0$ can include a transistor P1 coupled between node 231a and a node that has voltage V1, and a transistor N1 coupled between node 232a and ground. Transistors P1 and N1 can be controlled by signals BIASp and BIASn, respectively. Transistor P1, S1p, and S2p can include p-channel metal-oxide semiconductor (PMOS) transistors. Transistor N1, S1n, and S2n can include n-channel metal-oxide semiconductor (NMOS) transistors.

As shown in FIG. 3, adjustable current source 232 includes a combination of transistor N1, transistors N3 and switches S3. Transistors N3 and switches S3 are part of an adjustable current path 301, in which current generated by adjustable current source 232 can be adjusted (e.g., increased or decreased) by controlling the number of switches S3 that are turned on (or turned off). Code CELL_$CODE_0$ (generated by logic circuitry 161) can be used to control the number of switches S3 that are turned on (or off), thereby adjusting increasing or decreasing) the current between nodes 232a and ground.

FIG. 3 shows an example structure of DAC cell $141_0$ where adjustable current path 301 is coupled to node 232a of DAC cell $141_0$ in order to correct DAC cell error from transistor N1 (NMOS) side. However, in an alternative structure of DAC 141, DAC cell $141_0$ can include an adjustable current path coupled to node 231a (without adjustable current path 301 included in DAC cell $141_0$) in order to correct DAC cell error from transistor P1 (PMOS) side. In another alternative structure of DAC 141, DAC cell $141_0$ can include an extra adjustable current path coupled to node 231a (in addition to adjustable current path 301) in order to correct DAC cell error from both transistor P1 (PMOS) side and transistor N1 (NMOS) side.

Figure 4:
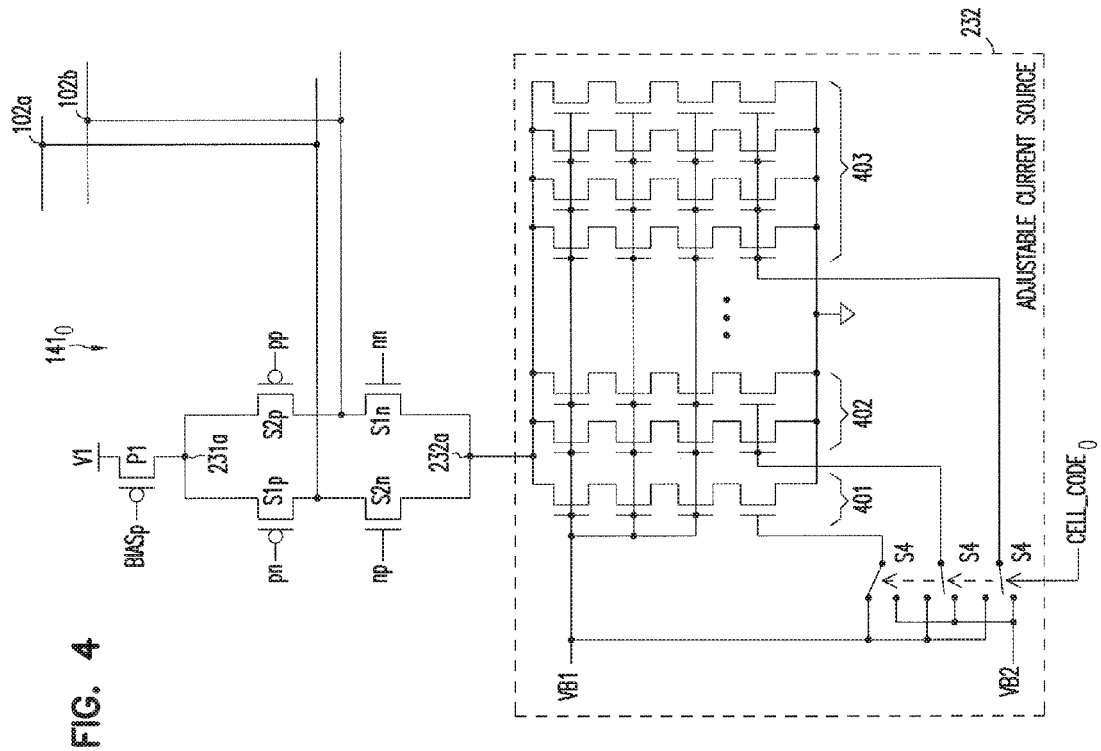
FIG. 4 shows a DAC cell of the DAC of FIG. 2, including another example of an adjustable current source of FIG. 2, according to some embodiments described herein.

FIG. 4 shows DAC cell $141_0$ of DAC 141 of FIG. 2 including another example of adjustable current source 232 of FIG. 2, according to some embodiments described herein. As shown in FIG. 4, adjustable current source 232 can include an array of transistors (e.g., NMOS transistors) that can be divided into groups 401, 402 and 403. Each of groups 401, 402 and 403 can cause different amounts of current to follow between node 232a and ground. The gates of transistors in groups 401, 402 and 403 can be separately controlled by a combination (e.g., binary combination) of bias voltages VB1 and VB2. This allows each of the transistors to be biased with a different voltage. Thus, adjustable current source 232 can generate different current between nodes 232a and ground based on different combinations of switches S4 that are turned on (or turned off). Code CELL_$CODE_0$ (generated by logic circuitry 161) can be used to control the number of switches S4 that are turned on (or off), thereby adjusting (e.g., increasing or decreasing') the current between nodes 232a and ground. The switching of the gates of the transistors in the array of transistors can be in parallel or also in series within the current source between nodes 232a and ground. Thus, any combination of the transistors in the array of transistors can be connected to either voltage VB1, voltage VB2, or both voltages VB1 and VB2.

FIG. 4 shows an example structure of DAC cell $141_0$ where correction of DAC cell error can be accomplished from adjusting a current in the adjustable current source from NMOS side (e.g., adjustable current source coupled to node 232a). However, in an alternative structure of DAC 141, correction of DAC cell error can be accomplished from adjusting a current in an adjustable current source from PMOS side (an adjustable current source coupled to node 231a). In another alternative structure of DAC 141, correction of DAC cell error can be accomplished from adjusting a current in an adjustable current source from PMOS side (an adjustable current source coupled to node 231a) and a current in an adjustable current source from PMOS side (adjustable current source 232 coupled to node 231a).

FIG. 5A is a timing diagram for signals applied to the transistors of reference cell $141_R$ and DAC cell $141_0$ during calibration of DAC cell $141_0$, according to some embodiments described herein. During calibration of a DAC cell, the polarity of the DAC cell under calibration can be set to be opposite from the polarity of the reference cell. The DAC cell can be placed in a positive polarity or a negative polarity. For example, in FIG. 2, DAC cell $141_0$ has a positive polarity when switches S2p and S2n are turned on (and switches S1p and S1n are turned oil) and a negative polarity when switches S1p and S1n are turned on (and switches S2p and S2n turned off). FIG. 5A shows signals pn, np, pp, and nn are used to control switches S1p, S1n, S2p, and S2n of reference cell $141_R$ and DAC cell $141_0$, such that they have opposite polarity.

Figure 5B:
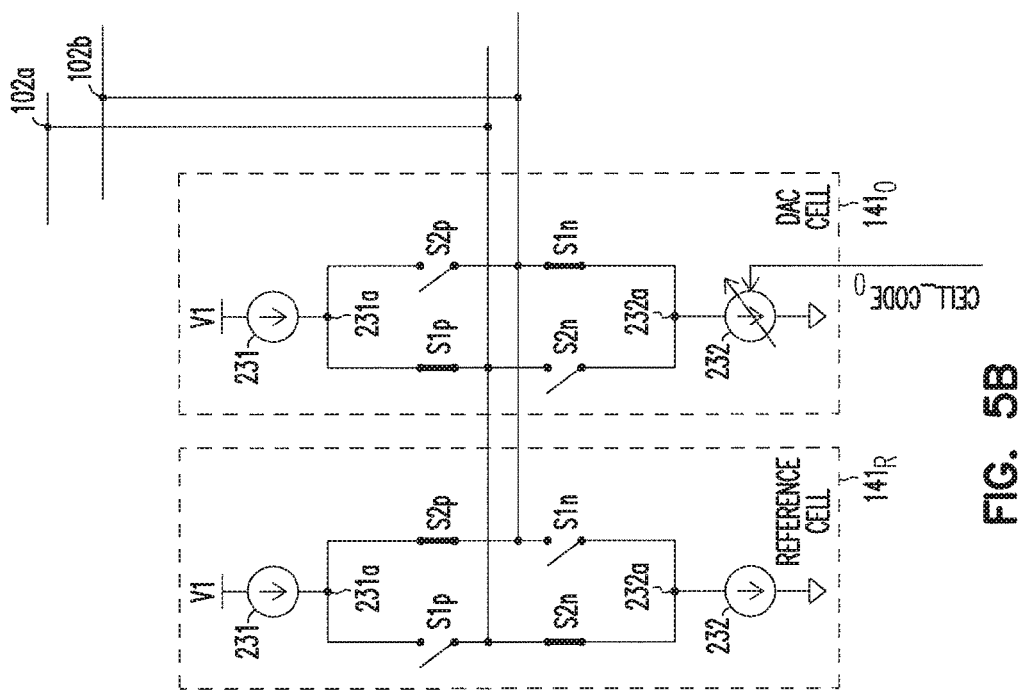
FIG. 5B shows the states of switches of a reference cell and DAC cell, during a calibration of a DAC cell using the timing of signals shown in FIG. 5A, according to some embodiments described herein.

FIG. 5B shows the states (e.g., ON or OFF) of switches S1p, S1n, S2p, and S2n of reference cell $141_R$ and DAC cell $141_0$, during a calibration of DAC cell $141_0$ using the timing of signal pn, np, pp, and nn shown in FIG. 5A, according to some embodiments described herein. As shown in FIG. 5B, DAC cell $141_0$ has a negative polarity whereas reference cell $114_R$ has a positive polarity. Placing a DAC cell ($141_0$ in this example) having an opposite polarity from the reference cell allows the measurement of the differential error of the DAC cell under calibration.

FIG. 5A also shows measured error of the DAC cell under calibration (e.g., DAC cell $141_0$) after each SAR cycle. For example, as shown in FIG. 5A, the calibration of DAC cell $141_0$ can correct its DAC cell error after six SAR cycles. The above examples associated with FIG. 5A and FIG. 5B relate to static error correction of a DAC cell. The following description relates to both static and dynamic correction of a DAC cell.

Figure 5C:
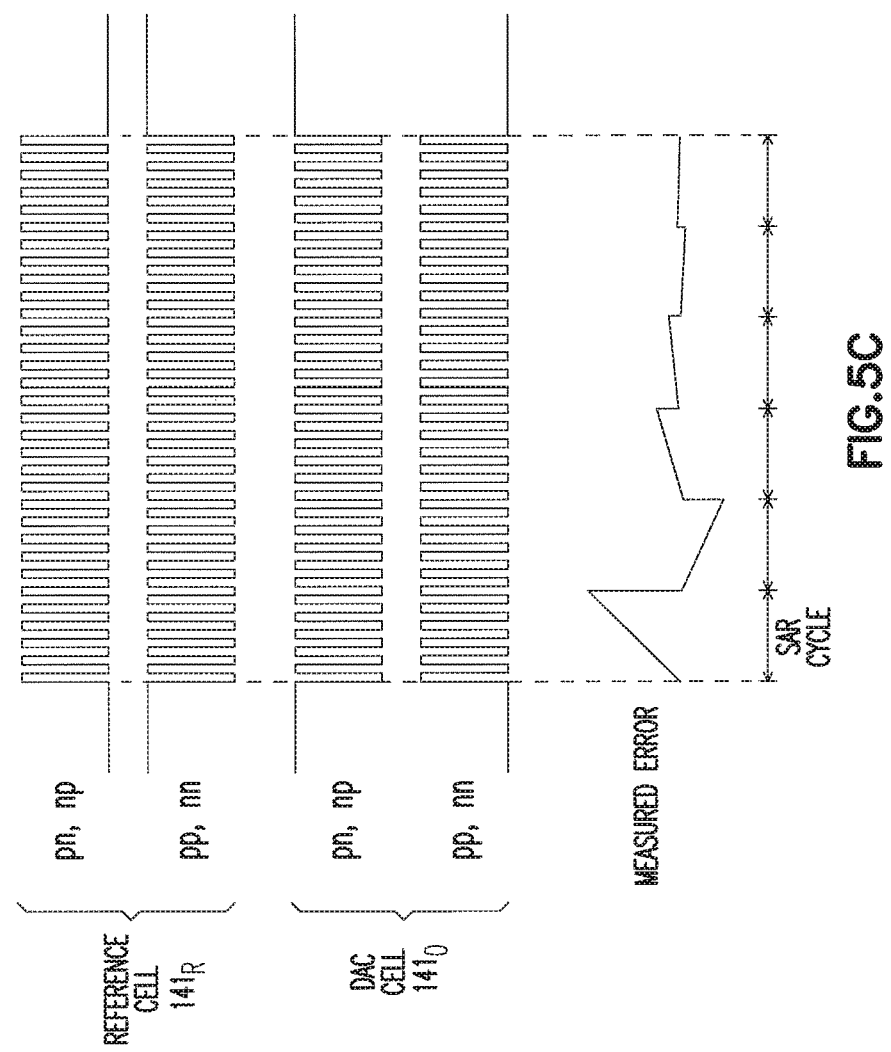
FIG. 5C is a timing diagram for signals applied to the transistors of a reference cell and DAC cell during calibration of a DAC cell, according to some embodiments described herein.

FIG. 5C is a timing diagram for signals applied to the transistors of reference cell $141_8$ and DAC cell $141_0$ during calibration of DAC cell $141_0$, according to some embodiments described herein. In order to additionally correct for dynamic errors of a DAC latch, the polarity settings of the reference cell $141_R$ and DAC cell $141_0$ can be toggled (e.g., switched) at a 50% duty cycle at half the clock frequency of the sigma-delta ADC 101. The polarity of reference cell $141_R$ is to be the opposite of DAC cell $141_0$. This allows for all switching errors of the latch at the ADC clock frequency to be taken into consideration when correcting each cell. The 50% duty cycle switching of the DAC cell over the integrator period should be higher than the measurement time of each SAR cycle. This average is similar to measuring the static error over time with noise.

Figure 6:
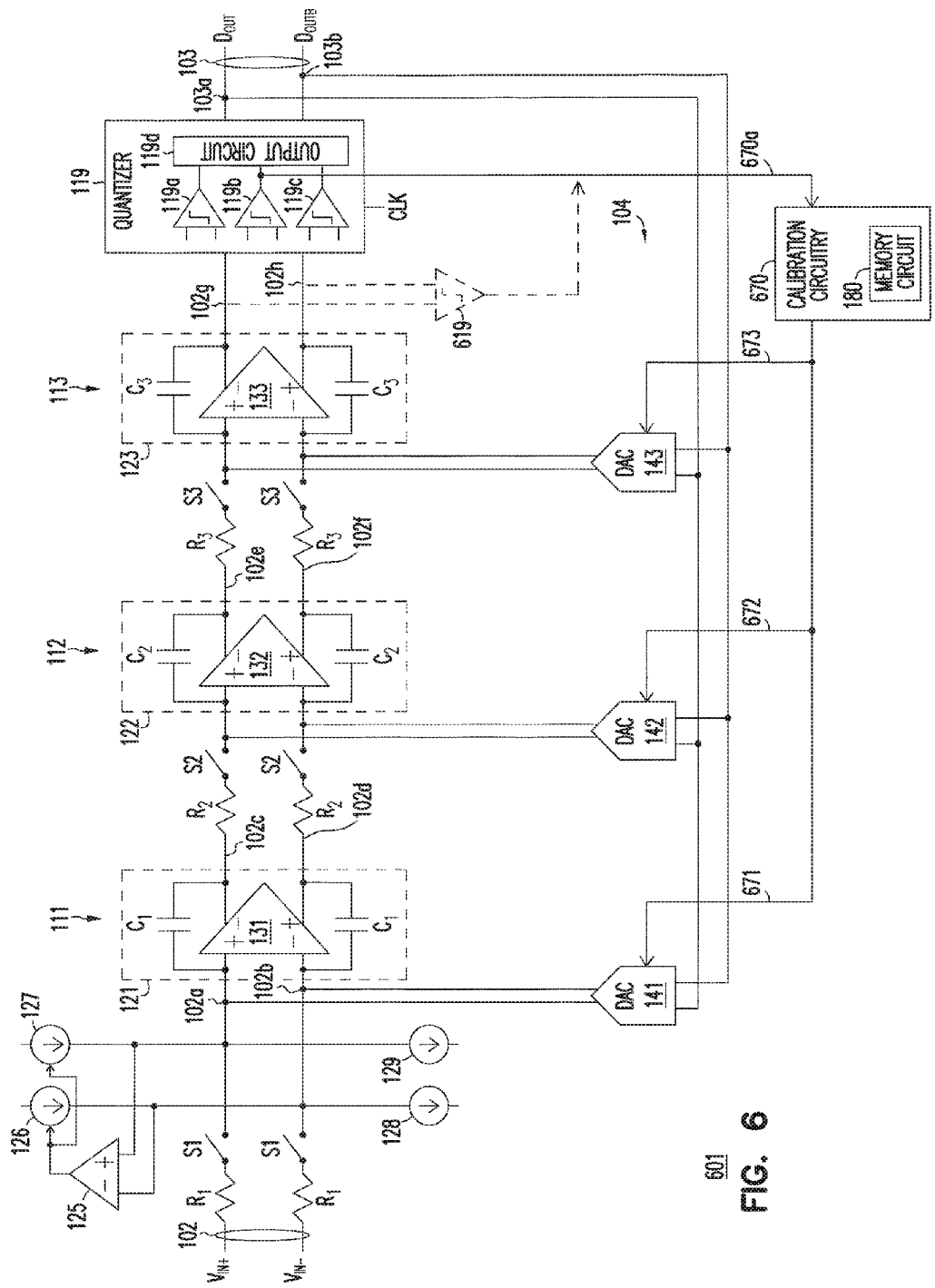
FIG. 6 shows a sigma-delta ADC including a loop filter and a quantizer having components for use in a calibration of DACs of sigma-delta ADC, according to some embodiments described herein.

FIG. 6 shows a sigma-delta ADC 601 including a loop filter and a quantizer having components for use in a calibration of DACs of sigma-delta ADC 601, according to some embodiments described herein. Sigma-delta ADC 601 includes elements similar to those of sigma-delta ADC 101 of FIG. 1A. Thus, for simplicity, the description of similar or identical elements is not repeated. As shown in FIG. 6, sigma-delta ADC 601 can include common mode circuitry that includes amplifier 125 and current sources 126, 127, 128, and 129 (which are similar to the components of common mode circuitry 120 of FIG. 1A and FIG. 1B). Sigma-delta ADC 601 can also include a connection 670a coupled between the output node of comparator 119b of quantizer 119 and an input of calibration circuitry 670.

Calibration circuitry 670 can perform a calibration to correct DAC cell errors similar to the calibration to correct DAC cell errors described above with reference to FIG. 1A through FIG. 5C, For example, as described above, an integrator (e.g., integrator 121) and a comparator (e.g., comparator 151) are used as part of components to perform the calibration. In FIG. 6, the calibration can use at least one of the integrators (e.g., at least one of integrators 121, 122, and 123) of the loop filter of sigma-delta ADC 601 and one of the comparators (e.g., comparator 119b) of quantizer 119 as part of components to perform the calibration. As shown in FIG. 6, comparator 119b may be the comparator (e.g., center comparator) that operates with voltages in the middle range of a reference voltage range for quantizer 119. Selecting a center comparator among the comparators of quantizer may improve accuracy of measured error during calibration of DAC cells of DACs 141, 142, and 143.

Since the integrators (e.g., integrators 121, 122, and 123) and the comparator (e.g., comparator 119b) used in the calibration are already included as parts of sigma-delta ADC 601, using them for calibration this way allows sigma-delta ADC 601 to avoid complex routing to DACs 141, 142, and 143. This also allows sigma-delta ADC 601 to be suitable for some technologies (e.g., submicron technology).

in an alternative structure of sigma-delta ADC 601, instead of using one of the comparators (e.g., comparator 119b) of quantizer 119, sigma-delta ADC 601 can include a comparator 619, which is not part of comparator circuitry of quantizer 119 (and can be located outside quantizer 119). As an example, comparator 619 can be comparator 513 of FIG. 1A. In the alternative structure, sigma-delta ADC 601 (FIG. 6) can use comparator 619 (instead of using one of the comparators of quantizer 119) with at least one of integrators 121, 122, and 123 of the loop filter of sigma-delta ADC 601 as part of components to perform the calibration of DAC cells of DACs 141, 142, and 143.

As shown in FIG. 6, calibration circuitry 670 can include output nodes coupled to DACs 141, 142, and 143 through connections 671, 672, and 673. During a calibration of DAC cells 141, 142, and 143 calibration circuitry 670 can provide codes to control an adjustable current source in each of the DAC cells to correct DAC cell errors.

Figure 7:
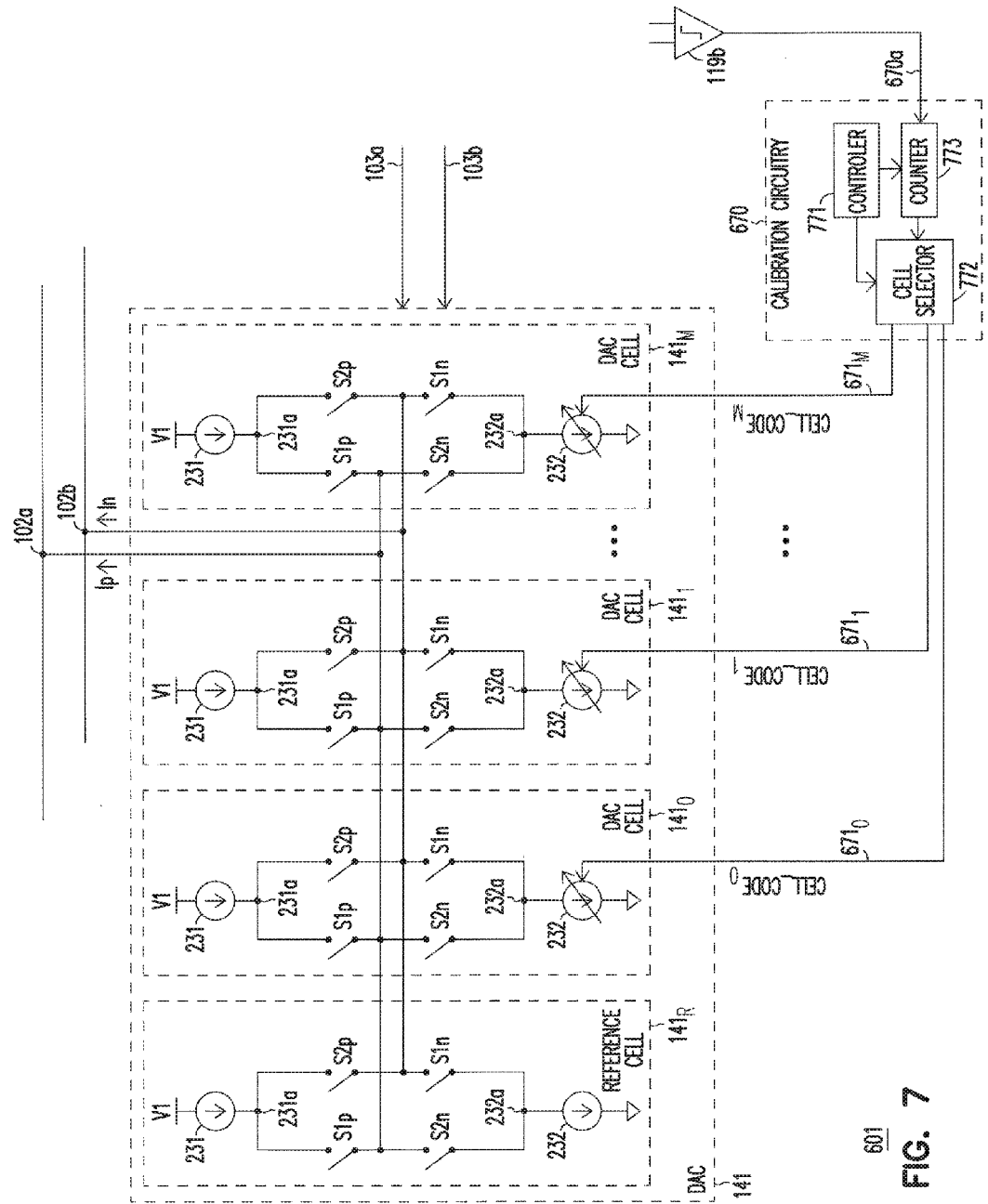
FIG. 7 shows a portion of the sigma-delta ADC of FIG. 6, including some components of calibration circuitry, and a reference cell and DAC cells of a DAC, according to some embodiments described herein.

FIG. 7 shows a portion of sigma-delta ADC 601 of FIG. 6, including some components of calibration circuitry 670, and reference cell $141_R$ and DAC cells $141_0$ through $141_M$ of DAC 141, according to some embodiments described herein. Sigma-delta ADC 601 shown in FIG. 7 includes element similar to those of sigma-delta ADC 101 of FIG. 2. Thus, for simplicity, the description of similar or identical elements is not repeated.

As shown in FIG. 7, calibration circuitry 670 can include a controller 771 (which can include a finite state machine), a DAC cell selector (e.g., a multiplexor (MUX)) 772, and a counter 773. Counter 773 can include an input node coupled to the output node of comparator 119b to receive information (e.g., results of the comparison performed on the signals at nodes 102g and 102h from the output nodes of integrator 123 (FIG. 6). During a calibration mode, calibration circuitry 670 can calibrate DAC cells $141_I$ through $141_M$ one at a time (e.g., in sequential fashion) against reference cell $141_R$ until all DAC cells of DAC 141 are calibrated. The DAC cells of DAC 141 that are not being calibrated can be disconnected (e.g., deactivated). Comparator 119b can perform a number of comparison to compare the difference between voltages at nodes 102g and 102h and provide a result at its output node. Counter 773 can generate counts based on the result (e.g., sign) provided by comparator 119b, Counter 773 can generate the codes that can be used to control (e.g., iteratively increase or decrease based on the sign of the error detected by comparator 119b) the amount of current generated by adjustable current source 232 of the DAC cell under calibration. The adjustment can stop when the difference between positive current Ip (at node 102a) and negative current In (at node 102b) settles to zero (e.g., Ip−In=0).

As shown in FIG. 7, selector 772 can form a path from the output of selector 772 to one of connections $671_0$ through $671_M$ to provide one of codes $CELL\_CODE_0$ through $CELL\_CODE_M$ to adjustable current source 232 of a respective DAC cell among DAC cells $141_0$ through $141_M$, depending on which DAC cell among DAC cells $141_0$ through $141_1$ is being calibrated.

The value of codes $CELL\_CODE_0$ through $CELL\_CODE_M$ can be different among each other, or some of codes $CELL\_CODE_0$ through $CELL\_CODE_M$ may be the same, depending of the amount of error caused by DAC cells $141_0$ through $141_M$.

FIG. 8A, FIG. 8B, and FIG. 8C show graphs representing integrated error, differential current, and code CELL_CODE, respectively, in time domain associated with the calibration of DAC cell $141_0$ of FIG. 7, according to some embodiments described herein. As shown in FIG. 8C, for each iteration among iterations 901 through 905 of a calibration of a DAC cell, a different code (e.g., one of codes 0 through 4) is generated based on the difference in current values between currents Ip and In. Code 4 generated during iteration 905 can be stored and used by the corresponding DAC cell during a normal mode (after the calibration of DACs 141, 142, and 143 (FIG. 6) is completed. The calibration time interval for each DAC cell can be the same (e.g., fixed at a predetermined amount of time). For example, each DAC cell can be calibrated for a calibration time interval 916 in which time T0 can be the start time of the calibration and time T1 can be the stop time of the calibration.

Mismatch of in the loop filter may limit the accuracy of the DAC calibration. Thus, two measurements (in two different calibrations) can be performed (e.g., one right after another) and then an average of the two measurements taken. Each of the two measurements can be performed with different combination of the polarity of the reference cell and the polarity of the DAC cell under calibration.

Figure 9A:
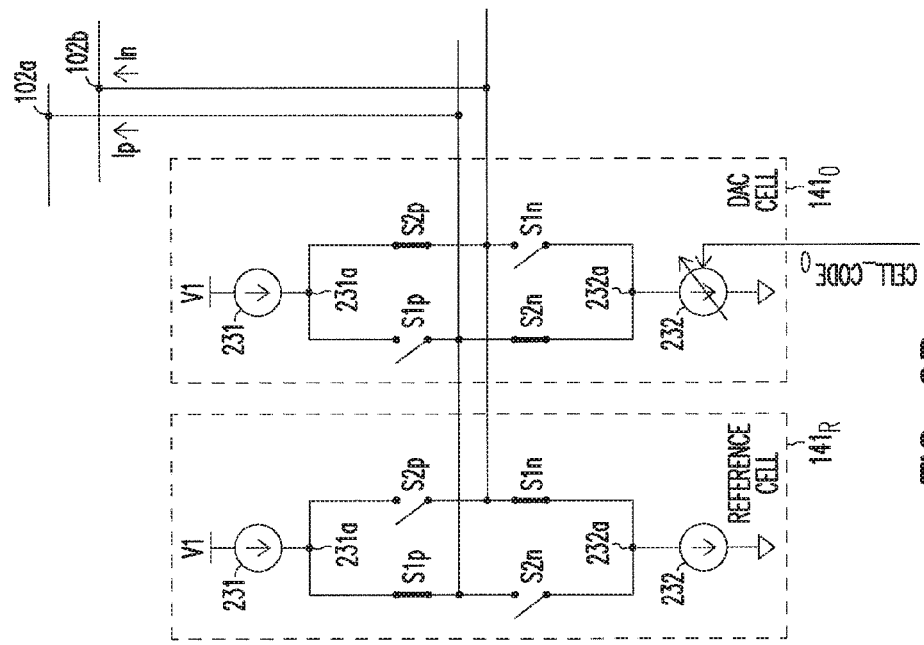
FIG. 9A shows the states of switches of the reference cell and the DAC cell, during one phase of calibration of the DAC cell, according to some embodiments described herein.

FIG. 9A shows the states (e.g., ON or OFF) of switches S1p, S1n, S2p, and S2n of reference cell $141_R$ and DAC cell $141_0$, during one phase of calibration of DAC cell $141_0$, according to some embodiments described herein. As shown in FIG. 9A, DAC cell $141_0$ has a negative polarity whereas reference cell $114_R$ has a positive polarity. A code can be obtained after calibration of DAC cell $141_0$ using the states of switches S1$p$, S1$n$, S2$p$, and S2$n$ shown in FIG. 9A.

Figure 9B:
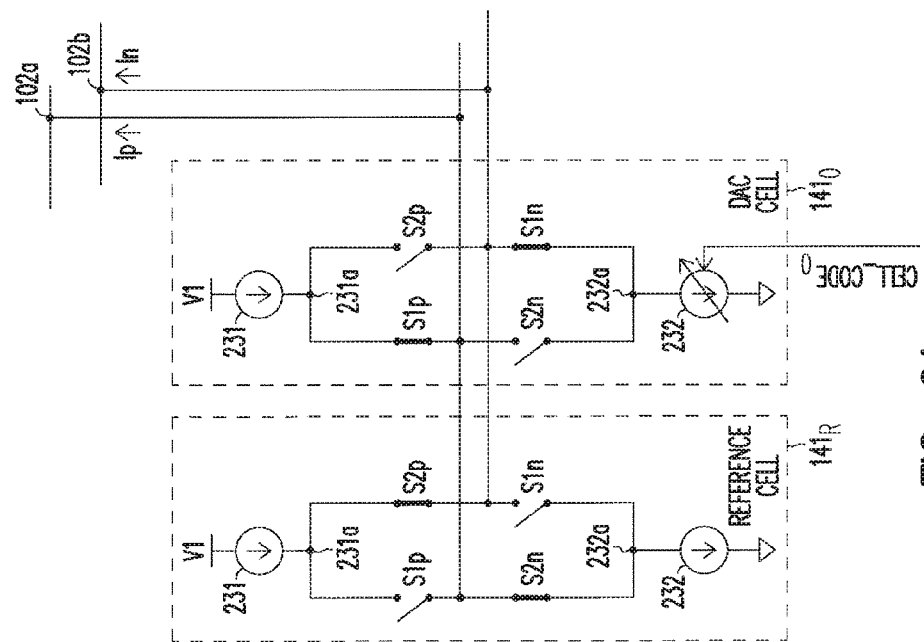
FIG. 9B shows the states of switches of reference cell and the DAC cell, during another phase of calibration of the DAC cell, according to some embodiments described herein.

FIG. 9B shows the states (e.g., ON or OFF) of switches S1$p$, S1$n$, S2$p$, and S2$n$ of reference cell $141_R$ and DAC cell $141_0$, during another phase of calibration of DAC cell $141_0$, according to some embodiments described herein. As shown in FIG. 9A, DAC cell $141_0$ has a positive polarity whereas reference cell 114$8$ has a negative polarity. Another code can be obtained after calibration of DAC cell $141_0$ using the states of switches S1$p$, S1$n$, S2$p$, and S2$n$ shown in FIG. 9B. Performing two different phases with polarity switching and averaging the two codes obtained from two different phases (e.g., phases associated with FIG. 9A and FIG. 9B) allows obtaining a correct measurement of the differential error of the DAC cell under calibration (under test) cancelling the offset error introduced by the loop filter mismatch.

Figure 10:
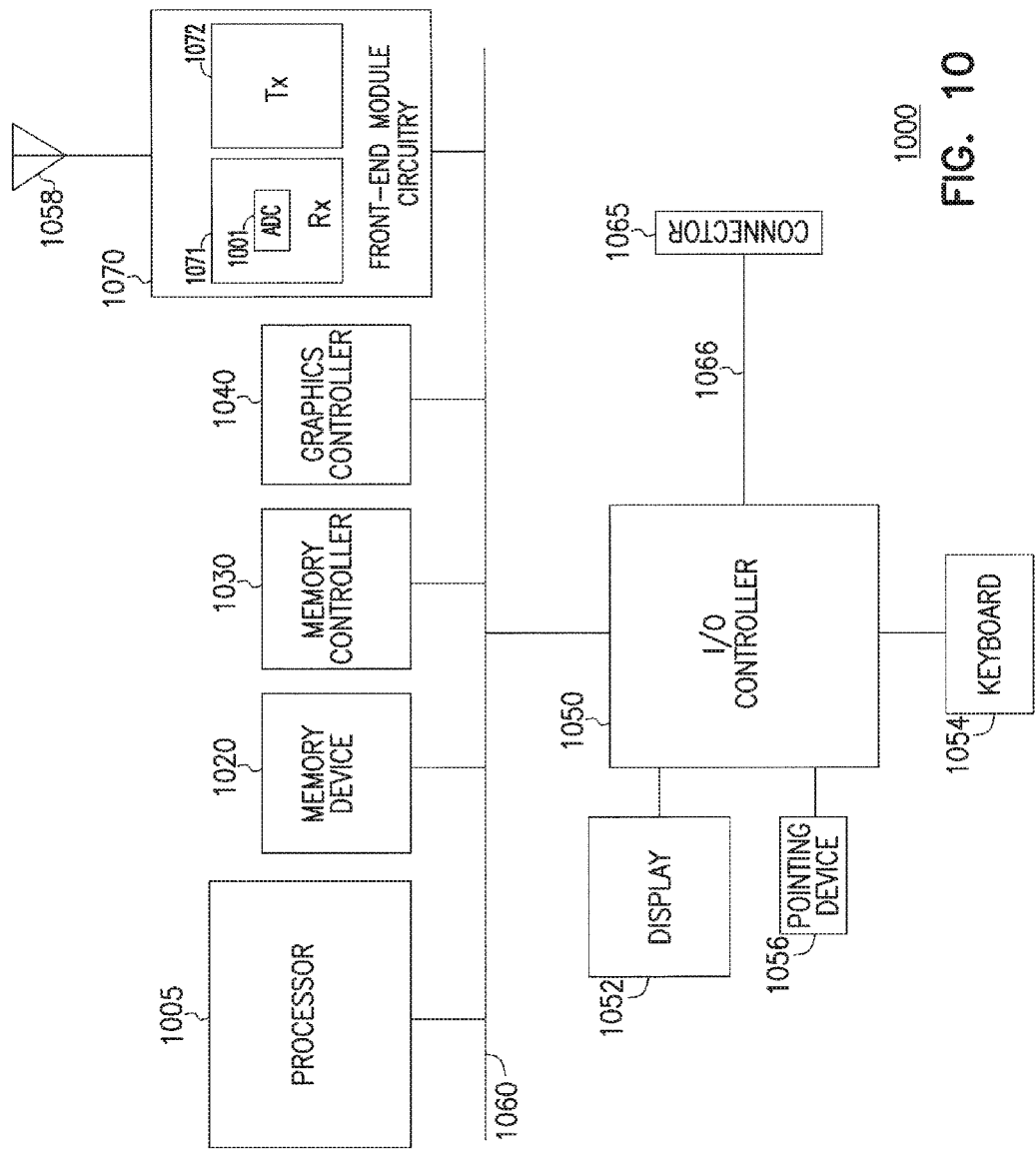
FIG. 10 shows an apparatus in the form of a system (e.g., electronic system), according to some embodiments described herein.

FIG. 10 shows an apparatus in the form of a system (e.g., electronic system) 1000, according to some embodiments described herein. System 1000 can include or be included in a computer, a tablet, a communication device (e.g., user equipment (UE), a DAC cellular phone, etc), or other electronic devices or systems. As shown in FIG. 10, system 1000 can include a processor 1005, a memory device 1020, a memory controller 1030, a graphics controller 1040, an input and output (I/O) controller 1050, a display 1052, a keyboard 1054, a pointing device 1056, at least one antenna 1058, a bus 1060, a connector 1065, and a front-end module circuitry 1070.

Each of processor 1005, memory device 1020, memory controller 1030, graphics controller 1040, and I/O controller 1050 can include an IC chip. In some arrangements, system 1000 does not have to include a display. Thus, display 1052 can be omitted from system 1000. In some arrangements, system 1000 does not have to include any antenna. Thus, antenna 1058 can be omitted from system 1000. Processor 1005 can include a general-purpose processor or an application specific integrated circuit (ASIC). Processor 1005 can include a central processing unit (CPU).

Memory device 1020 can include a dynamic random access memory (DRAM) device, a static random access memory (SRAM) device, a flash memory device, phase change memory, a combination of these memory devices, or other types of memory. FIG. 10 shows an example where memory device 1020 is a stand-alone memory device separated from processor 1005. In an alternative arrangement, memory device 1020 and processor 1005 can be located on the same die (e.g., a semiconductor die). In such an alternative arrangement, memory device 1020 is an embedded memory in processor 1005, such as embedded DRAM (eDRAM), embedded SRAM (eSRAM), embedded flash memory, or another type of embedded memory.

Display 1052 can include a liquid crystal display (LCD), a touchscreen (e.g., capacitive or resistive touchscreen), or another type of display. Pointing device 1056 can include a mouse, a stylus, or another type of pointing device.

I/O controller 1050 can include a communication module for wired or wireless communication (e.g., communication through front-end module circuitry 1070 and one or more antenna 1058). Such wireless communication may include communication in accordance with Bluetooth communication technique, WiFi communication technique, Long Term Evolution Advanced (LTE-A) communication technique, or other communication techniques.

I/O controller 1050 can also include a module to allow system 1000 to communicate with other devices or systems, in accordance with to one or more of the following standards or specifications (e.g., I/O standards or specifications), including Universal Serial Bus (USB), DisplayPort (DP), High-Definition Multimedia Interface (HDMI), Thunderbolt, Ethernet, Peripheral Component Interconnect Express (PCIe), and other specifications.

Connector 1065 can be arranged (e.g., can include terminals, such as pins) to allow system 1000 to be coupled to an external device (or system). This may allow system 1000 to communicate (e.g., exchange information) with such a device (or system) through connector 1065. Connector 1065 may be coupled to I/O controller 1050 through a connection 1066 (e.g., a bus). Connector 1065, connection 1066, and at least a portion of bus 1060 can include conductive lines that conform with at least one of USB, DP, HDMI, Thunderbolt, PCIe, Ethernet, and other specifications.

Antenna 1058 can include one or more directional or omnidirectional antennas, including, for example, dipole antennas, monopole antennas, patch antennas, loop antennas, microstrip antennas or other types of antennas suitable for transmission of RF signals.

Front-end module circuitry 1070 can include a receiver (Rx) 1071 and a transmitter (Tx) 1072. Transmitter 1072 can operate to transmit information from system 1000 to an external device or system through antenna 1058. Receiver 1071 can operate to receive input information (e.g., analog input signals) from antenna 1058. Receiver 1071 can include an ADC 1001, which can include any of the sigma-delta ADCs 101 and 601 described above with reference to FIG. 1A through FIG. 9.

FIG. 10 shows the components of system 1000 arranged separately from each other as an example. For example, each of processor 1005, memory device 1020, memory controller 1030, graphics controller 1040, I/O controller 1050, and front-end module circuitry 1070 can be located on a separate IC (e.g., semiconductor die or an IC chip). In some arrangements, two or more components (e.g., processor 1005, memory device 1020, graphics controller 1040, I/O controller 1050, and front-end module circuitry 1070) of system 1000 can be located on the same die (e.g., same IC chip) that forms a system-on-chip (SoC).

Figure 11:
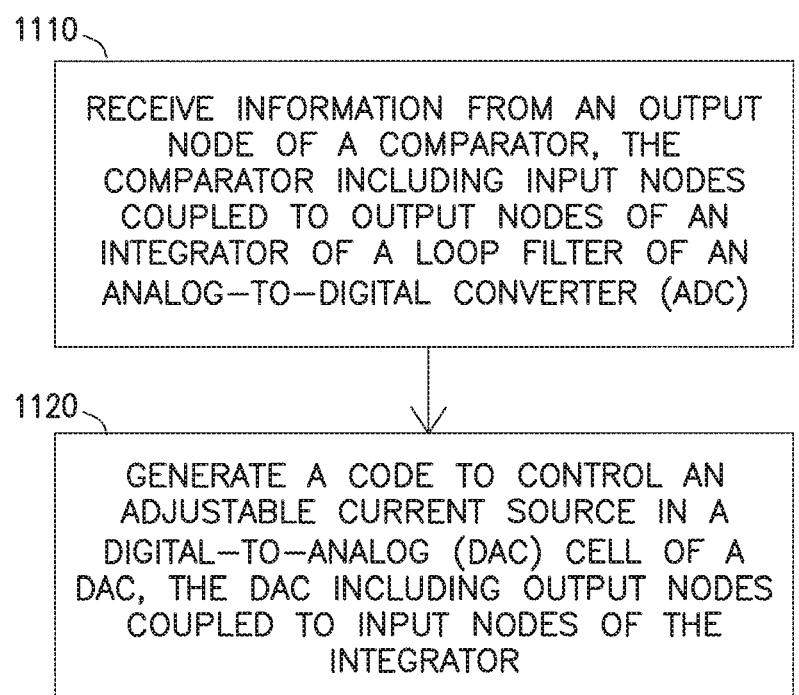
FIG. 11 is a flowchart showing a method of processing signals, according to some embodiments described herein

FIG. 11 is a flowchart showing a method 1100 of processing signals, according to some embodiments described herein. Method 1100 can be used in (e.g. performed by) a device or system that includes a sigma-delta ADC. Such a sigma-delta ADC can include any of sigma-delta ADCs 101 and 601 described above with reference to FIG. 1A through FIG. 10. Thus, activities of method 1100 can include operations performed by any of sigma-delta ADCs described above with reference to FIG. 1A through FIG. 10.

In FIG. 11, activity 1110 can include receiving information from an output node of a comparator, the comparator including input nodes coupled to output nodes of an integrator of a loop filter of an ADC. Activity 1120 can include generating a code to control an adjustable current source in a DAC cell of a DAC, the DAC including output nodes coupled to input nodes of the integrator.

Method 1100 can include fewer or more activities relative to the activities shown in FIG. 11. For example, method 1100 can include activities and operations of any of sigma-delta ADCs described above with reference to FIG. 1A through FIG. 11.

The illustrations of the apparatuses (e.g., sigma-delta ADC's 101 and 601 and system 1000) and methods (e.g., method 1100 and operations of sigma-delta ADCs 101 and 601, and system 1000) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses electronic systems), such as televisions, DAC cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 11) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including an integrator in a loop filter of an analog-to-digital converter (ADC), a digital-to-analog converter (DAC) located on a feedback path of the ADC, the DAC including output nodes coupled to input nodes of the integrator, and a comparator including input nodes to receive signals from output nodes of the integrator, and an output node to provide information during calibration of the DAC.

In Example 2, the subject matter of Example 1 may optionally include, wherein the comparator is part of comparator circuitry of a quantizer coupled to the loop filter.

In Example 3, the subject matter of Example 1 or 2 may optionally include, wherein the loop filter further includes an additional integrator, an additional DAC located on the feedback path of the ADC, the additional DAC including output nodes coupled to input nodes of the additional integrator, and an additional comparator including input nodes to receive signals from output nodes the additional integrator, and an output node to provide information during calibration of the additional DAC.

In Example 4, the subject matter of Example 3 may optionally include, comprising calibration circuitry to calibrate a DAC cell of the DAC and a. DAC cell of the additional DAC in parallel.

In Example 5, the subject matter of Example 1 may optionally include, wherein further comprising a current source coupled to one of the input nodes of the integrator, and an amplifier to control the current source based on voltages at the input nodes of the integrator.

In Example 6, the subject matter of Example 5 may optionally include, wherein further comprising an additional current source coupled to another one the input nodes of the integrator, wherein the amplifier is to control the additional current source based on the voltages at the input nodes of the integrator.

In Example 7, the subject matter of Example 1 may optionally include, wherein the DAC includes a DAC cell, the DAC cell including an adjustable current source, the adjustable current source including an array of transistors.

In Example 8, the subject matter of Example 7 may optionally include, wherein the array of transistors is selected based on a combination of two voltages.

In Example 9, the subject matter of Example 8 may optionally include, further comprising calibration circuitry to calibrate a DAC cell of the DAC during a first phase of calibration to obtain a first code, to calibrate the DAC cell of the DAC during a second phase of calibration to obtain a second code, and to generate an average of the first and second codes to control an adjustable current source of the DAC cell.

In Example 10, the subject matter of Example 1 may optionally include, further comprising a counter to receive information from the comparator and generate a code to control an adjustable current of a DAC cell of the DAC.

In Example 11, the subject matter of Example 1 may optionally include, further comprising calibration circuitry to toggle transistors of a DAC cell of the DAC during calibration of the DAC cell.

Example 12 includes subject matter (such as a device, an electronic apparatus (e.g., circuit, electronic system, or both), or a machine) including an integrator in a loop filter of a sigma-delta analog-to-digital converter (ADC), a digital-to-analog converter (DAC) located on a feedback path of the ADC, the DAC including output nodes coupled to input nodes of the integrator, the DAC including DAC cells, a comparator including input nodes to receive signals from output nodes of the integrator, and logic circuitry to receive information from an output node of the comparator, the logic circuitry to provide a code to control an adjustable current source in one of the DAC cells.

In Example 13, the subject matter of Example 12 may optionally include, wherein the output node of the comparator is coupled to an output circuit of a quantizer coupled to the loop filter.

In Example 14, the subject matter of Example 12 or 13 may optionally include, wherein the adjustable current source includes a first group of transistors coupled in series between a node in the DAC cell and ground, a second group of transistors coupled in series between the node and ground, and a third group of transistors coupled in series between the node and ground.

In Example 15, the subject matter of Example 12 may optionally include, wherein the logic circuitry includes a successive approximation register (SAR) logic to receive the information.

In Example 16, the subject matter of Example 15 may optionally include, wherein further comprising a selector to selectively provide codes from the SAR logic to the DAC cells.

In Example 17, the subject matter of Example 12 may optionally include, wherein further comprising calibration circuitry to toggle transistors of a DAC cell of the DAC at 50% duty cycle during calibration of the DAC cell.

In Example 18, the subject matter of Example 12 may optionally include, wherein the DAC includes a current steering DAC.

Example 19 includes subject matter (such as a device, an electronic apparatus (e.g., circuit, electronic system, or both), or a machine) including an antenna, and a receiver coupled to the antenna, the receiver including a sigma-delta analog-to-digital converter (ADC), the sigma-delta ADC including an integrator in a loop filter of an analog-to-digital converter (ADC), a digital-to-analog converter (DAC) located on a feedback path of the ADC, the DAC including output nodes coupled to input nodes of the integrator, and a comparator including input nodes to receive signals from output nodes of the integrator, and an output node to provide information during calibration of the DAC.

In Example 20, the subject matter of Example 19 may optionally include, wherein the receiver is included in a front-end module circuitry of the apparatus.

Example 21 includes subject matter (such as a method of operating a device, an electronic apparatus (e.g., circuit, electronic system, or both), or a machine) including receiving information from an output node of a comparator, the comparator including input nodes coupled to output nodes of an integrator of a loop filter of an analog-to-digital converter (ADC), and generating a code to control an adjustable current source in a digital-to-analog converter (DAC) cell of a DAC, the DAC including output nodes coupled to input nodes of the integrator.

In Example 22, the subject matter of Example 21 may optionally include, wherein further comprising toggling a transistor of the DAC cell of the DAC at 50% duty cycle during calibration of the DAC cell, wherein the code is generated during the calibration of the DAC cell.

In Example 23, the subject matter of Example 21 may optionally include, wherein generating the code includes performing a first phase of calibration of the DAC cell to generate a first code, performing a second phase of calibration of the DAC cell to generate a second code, and taking an average of the first and second codes to generate the code In Example 24, the subject matter of Example 21 may optionally include, wherein further comprising receiving information from output of an additional comparator, the additional comparator including input nodes coupled to output nodes of an additional integrator of the loop filter, and generating an additional code to control an adjustable current source in a DAC cell of an additional DAC, the additional DAC including output nodes coupled to input nodes of the additional integrator.

In Example 25, the subject matter of Example 21 may optionally include, wherein the code and the additional codes are generated in parallel.

Example 26 includes subject matter (such as a device, an electronic apparatus (e.g., circuit, electronic system, or both), or machine) including means for performing any of the methods of claims 21-25.

The subject matter of Example 1 through Example 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   an integrator in a loop filter of an analog-to-digital converter (ADC);
   a digital-to-analog converter (DAC) located on a feedback path of the ADC, the DAC including output nodes coupled to input nodes of the integrator; and
   a comparator including input nodes to receive signals from output nodes of the integrator, and an output node to provide information during calibration of the DAC, the loop filter including an additional integrator, and an additional DAC located on the feedback path of the ADC, the additional DAC including output nodes coupled to input nodes of the additional integrator.

2. The apparatus of claim 1, wherein the comparator is part of comparator circuitry of a quantizer coupled to the loop filter.

3. An apparatus comprising:
   an integrator in a loop filter of an analog-to-digital converter (ADC);
   a digital-to-analog converter (DAC) located on a feedback path of the ADC, the DAC including output nodes coupled to input nodes of the integrator; and
   a comparator including input nodes to receive signals from output nodes of the integrator, and an output node to provide information during calibration of the DAC, wherein the loop filter further includes:
   an additional integrator;
   an additional DAC located on the feedback path of the ADC, the additional DAC including output nodes coupled to input nodes of the additional integrator; and
   an additional comparator including input nodes to receive signals from output nodes the additional integrator, and an output node to provide information during calibration of the additional DAC.

4. The apparatus of claim 3, further comprising calibration circuitry to calibrate a DAC cell of the DAC and a DAC cell of the additional DAC in parallel.

5. The apparatus of claim 1, further comprising a current source coupled to one of the input nodes of the integrator, and an amplifier to control the current source based on voltages at the input nodes of the integrator.

6. The apparatus of claim 5, further comprising an additional current source coupled to another one the input nodes of the integrator, wherein the amplifier is to control the additional current source based on the voltages at the input nodes of the integrator.

7. The apparatus of claim 1, wherein the DAC includes a DAC cell, the DAC cell including an adjustable current source, the adjustable current source including an array of transistors.

8. The apparatus of claim 7, wherein the array of transistors is selected based on a combination of two voltages.

9. The apparatus of claim 8, further comprising calibration circuitry to calibrate a DAC cell of the DAC during a first phase of calibration to obtain a first code, to calibrate the DAC cell of the DAC during a second phase of calibration to obtain a second code, and to generate an average of the first and second codes to control an adjustable current source of the DAC cell.

10. The apparatus of claim 1, further comprising a counter to receive information from the comparator and generate a code to control an adjustable current of a DAC cell of the DAC.

11. The apparatus of claim 1, further comprising calibration circuitry to toggle transistors of a DAC cell of the DAC during calibration of the DAC cell.

12. An apparatus comprising:
    an integrator in a loop filter of a sigma-delta analog-to-digital converter (ADC);
    a digital-to-analog converter (DAC) located on a feedback path of the ADC, the DAC including output nodes coupled to input nodes of the integrator, the DAC including DAC cells;

a comparator including input nodes to receive signals from output nodes of the integrator; and logic circuitry to receive information from an output node of the comparator, the logic circuitry to provide a code to control an adjustable current source in one of the DAC cells, the loop filter including an additional integrator, and an additional DAC located on the feedback path of the ADC, the additional DAC including output nodes coupled to input nodes of the additional integrator.

13. The apparatus of claim 12, wherein the output node of the comparator is coupled to an output circuit of a quantizer coupled to the loop filter.

14. The apparatus of claim 12, wherein the adjustable current source includes a first group of transistors coupled in series between a node in the DAC cell and ground, a second group of transistors coupled in series between the node and ground; and a third group of transistors coupled in series between the node and ground.

15. The apparatus of claim 12, wherein the logic circuitry includes a successive approximation register (SAR) logic to receive the information.

16. The apparatus of claim 15, further comprising a selector to selectively provide codes from the SAR logic to the DAC cells.

17. The apparatus of claim 12, further comprising calibration circuitry to toggle transistors of a DAC cell of the DAC at 50% duty cycle during calibration of the DAC cell.

18. The apparatus of claim 12, wherein the DAC includes a current steering DAC.

19. An apparatus comprising:
an antenna; and
a receiver coupled to the antenna, the receiver including a sigma-delta analog-to-digital converter (ADC), the sigma-delta ADC including:
an integrator in a loop filter of an analog-to-digital converter (ADC);
a digital-to-analog converter (DAC) located on a feedback path of the ADC, the DAC including output nodes coupled to input nodes of the integrator; and
a comparator including input nodes to receive signals from output nodes of the integrator, and an output node to provide information during calibration of the DAC, the loop filter including an additional integrator, and an additional DAC located on the feedback path of the ADC, the additional DAC including output nodes coupled to input nodes of the additional integrator.

20. The apparatus of claim 19, wherein the receiver is included in a front-end module circuitry of the apparatus.

* * * * *